United States Patent
Punzo et al.

(10) Patent No.: US 11,204,407 B2
(45) Date of Patent: Dec. 21, 2021

(54) MAGNETIC FIELD SENSOR, METHOD FOR OPERATING THE SAID MAGNETIC FIELD SENSOR AND METHOD AND SYSTEM FOR COMPENSATION MAGNETIC NOISE CAUSED BY ENVIRONMENTAL NOISE

(71) Applicant: Esaote S.p.A., Genoa (IT)

(72) Inventors: Vincenzo Punzo, Genoa (IT); Paolo Iaia, Genoa (IT); Alessandro Trequattrini, Genoa (IT)

(73) Assignee: ESAOTE S.P.A., Genoa (IT)

( * ) Notice: Subject to any disclaimer, the term of this patent is extended or adjusted under 35 U.S.C. 154(b) by 0 days.

(21) Appl. No.: 16/779,894

(22) Filed: Feb. 3, 2020

(65) Prior Publication Data
US 2020/0249295 A1 Aug. 6, 2020

(30) Foreign Application Priority Data
Feb. 4, 2019 (EP) .................................... 19155249

(51) Int. Cl.
| | | |
|---|---|---|
| *G01R 33/387* | (2006.01) | |
| *G01R 33/00* | (2006.01) | |
| *G01R 33/09* | (2006.01) | |
| *G01R 33/48* | (2006.01) | |

(52) U.S. Cl.
CPC ....... *G01R 33/387* (2013.01); *G01R 33/0017* (2013.01); *G01R 33/09* (2013.01); *G01R 33/48* (2013.01)

(58) Field of Classification Search
CPC .. G01R 33/387; G01R 33/0017; G01R 33/09; G01R 33/48; G01R 33/389; G01R 33/025; G01R 33/56563

USPC .......................................................... 324/307
See application file for complete search history.

(56) References Cited

U.S. PATENT DOCUMENTS

| | | | |
|---|---|---|---|
| 7,504,825 B2 | 3/2009 | Pittaluga et al. | |
| 2002/0195977 A1* | 12/2002 | Goto .................... | G01R 33/389 315/368.25 |
| 2014/0062475 A1* | 3/2014 | Koch ............... | G01R 33/56563 324/309 |
| 2017/0285122 A1* | 10/2017 | Kaditz ................. | G01R 33/448 |
| 2018/0348014 A1* | 12/2018 | Astley ..................... | H04N 5/33 |

FOREIGN PATENT DOCUMENTS

EP          1353192 B1    12/2009

* cited by examiner

*Primary Examiner* — Christopher P McAndrew
(74) *Attorney, Agent, or Firm* — Buchanan Ingersoll & Rooney PC

(57) ABSTRACT

Magnetic field sensor, in particular for measuring magnetic noise fields caused by environmental magnetic noise in combination with MRI apparatus, the magnetic field sensor being further provided with field compensation coils assembly and with a compensation circuit driving the field compensation coils assembly to generate a magnetic field compensating the static magnetic field dissipating outside from the static magnetic field generator or from the gantry of the MRI apparatus at the position of the magnetic sensor. A method for operating the magnetic field sensor and a method and a system for compensation magnetic noise caused by environmental noise are also provided. An MRI apparatus is also disclosed comprising such a system and carrying out such a method for compensating magnetic noise fields.

15 Claims, 4 Drawing Sheets

MAGNETIC FIELD SENSOR, METHOD FOR OPERATING THE SAID MAGNETIC FIELD SENSOR AND METHOD AND SYSTEM FOR COMPENSATION MAGNETIC NOISE CAUSED BY ENVIRONMENTAL NOISE

BACKGROUND

The invention relates to a magnetic field sensor, in particular for measuring magnetic noise fields caused by environmental magnetic noise in combination with MRI apparatus.

In the state of the art methods and systems for compensating for magnetic noise fields in spatial a volume in combination with MRI apparatus are known, for example from document EP1353192B1 and from document U.S. Pat. No. 7,504,825 assigned to the same applicant.

According to the said state of the art documents, a method for compensating of magnetic noise fields in a spatial volume comprises the following steps:

determining characteristic data or parameters describing a magnetic noise field outside said spatial volume;

defining, on a theoretical basis, i.e. according to the laws of electromagnetism, or on an empirical basis, the correlation between the noise field outside the spatial volume and a corresponding noise field inside said spatial volume, or calculating the noise field inside the spatial volume, from the measurement/s of the magnetic field outside the spatial volume;

from the inside magnetic field, as determined theoretically or empirically, generating a magnetic compensation field, particularly for neutralizing the noise field in said spatial volume.

In the following description and claims, "noise fields" shall be intended as magnetic field fluctuations induced in a spatial volume, particularly the imaging cavity of Magnetic Resonance imaging apparatuses, which fluctuations are caused by magnetic fields outside said spatial volume or the imaging cavity of the MRI apparatus.

The term characteristic parameters describing a magnetic noise field refer primarily to the strength of the magnetic noise field and may also include the direction of the magnetic noise field which can be measured by a three axial magnetometer or similar instruments.

Currently, the wide use of electric power causes the generation of considerable magnetic fields, which pervade the environment. These magnetic fields may have considerable strengths and affect or alter the operation of electric or electronic equipment which use magnetic fields. Such equipment may be of any type, e.g. measuring instruments, diagnostic or therapeutic imaging apparatuses, and the like.

Currently, the above noise may be caused by two types of magnetic fields, which are differentiated on the basis of frequency and of the amplitude of strength of the magnetic field. A first so-called low-frequency type includes magnetic fields with frequencies ranging from less than 1 Hz to a few units of Hz. These types of low-frequency noise fields are typically generated by the passage of vehicles or the like. Each vehicle generates, in first approximation, a magnetic dipole with a predetermined strength and a predetermined position and the dipoles are oriented in the direction of the earth's magnetic field flow lines.

A second type includes noise fields generated by sources of mains AC, which have frequencies of about 50 to 60 Hz. Besides home or static sources, electric vehicles shall be also considered, such as trains, tramcars, subway trains, trolleybuses, etc., due to the considerable powers absorbed and the strengths of the fields generated thereby.

A third category might include noise fields with frequencies of the order of a fraction of the mains frequency, i.e. of about 10 to 20 Hz. Particularly, some railway electrification lines use, for instance, one-third of the mains frequency, that is a frequency of the order of 16 Hz.

Other noise fields consist of fast, i.e. high-frequency transients. In spatial volumes containing significant electrically conductive masses, e.g. shielding magnetic structures or Faraday cages, these fast transient fluctuations of the magnetic noise field induce noise currents, which modify the noise fields inside the imaging cavity. These fast magnetic field transients may be also combined with other noise types.

Currently, the methods of compensation for magnetic fields like the ones described hereinbefore use one or more sensors for determining the magnetic field amplitude and frequency.

The noise field inside the spatial volume is compensated by generating an inverse magnetic field to the magnetic noise field inside the spatial volume.

This is actuated by providing a magnetic field compensator generating the compensation magnetic field inside the spatial volume.

In this document, a compensation method for the magnetic noise inside the spatial volume, for example the gantry of the MRI apparatus is determined according to a transfer function of the magnetic noise field measured outside said spatial volume and by generating a magnetic compensation field, which compensates the magnetic noise field determined according to said transfer function.

In said prior art solution, the system for carrying out the compensation method is an active open loop compensation.

The system for carrying out the magnetic compensation comprises a magnetic compensation field generator which generates a magnetic compensation field permeating limited to the spatial volume, for example a magnetic compensation field generator which is housed within the magnetic structure of an MRI scanner.

FIG. 1 illustrates a block diagram illustrating the system according to the prior art according to an embodiment in which said system is applied to an MRI apparatus.

Generally, MRI apparatus are housed inside a Faraday cage 110 for shielding electromagnetic noise.

A magnet structure which is summarized as a box 150 and generally comprising a static magnetic field generator in a spatial volume, gradient coils for generating gradient magnetic fields inside said spatial volume, RF-coils for generating RF excitation signals of the nuclear spins due to the physical capacity of atomic nuclei of absorbing and re-emitting electromagnetic radiation, RF-antenna for collecting the RF signals emitted by the transition of the nuclear magnetic spins from the excited condition in which the nuclei has absorbed electromagnetic energy into the relaxed condition in which the nuclei has re-emitted the absorbed electromagnetic energy.

Different kinds of static magnetic field generators are known which are principally:

Superconductive magnets in which a superconductive coil is energized to produce the static magnetic field, Resistive magnetic field generators, in which electric conductive coils are energized to generate a magnetic field, and Permanent magnets in which permanently magnetized material is used to generate the static magnetic field. Magnets combining said different technologies are also provided.

A generic structure of an MRI apparatus further comprises:

a magnet driving and control section which is responsible for driving the resistive or superconductive magnets such that a certain static magnetic field is generated or which controls the temperature of the magnetized material in case of permanent magnets;

a compensation magnetic field generator and a compensation magnetic field controller for driving said compensation magnetic field generator in such a way as to compensate magnetic noise fields;

a gradient coils driving unit which provides driving of the gradient coils in a synchronized way with the generation and transmission of the RF-excitation signals;

a RF generation unit for generating the RF excitation signals to be transmitted by the RF excitation coils to the target region of a body under examination and which region is coincident or contained inside a spatial volume, i.e. an imaging volume permeated by the static magnetic field and the gradient magnetic fields;

a processing unit of the RF signals acquired by the RF antenna for transforming said RF signals in image data;

a display control unit for processing the image data in order to display these data according to different display modes on a display monitor.

The static magnetic field provides for the orientation of the magnetic nuclear spins along a uniform direction which is parallel to the direction of the static magnetic field. A high spatial homogeneity of the static magnetic field is necessary in order that the RF data can be processed to image data reproducing the internal structure of a target region being examined without introducing artefacts.

Magnetic noise fields which permeates the spatial volume 160 add to the static magnetic field compromising the homogeneity of the static magnetic field.

As illustrated by FIG. 1 the magnetic noise fields 100 penetrate through the Faraday cage 110 and permeate into the spatial volume 160, in which they add to the static magnetic field B0.

A magnetic compensation field is applied by a magnetic compensation field generator 170 provided inside the magnetic structure 150. This magnetic compensation field generator is in the form of one or more resistive coils which are combined or simply overlaid to the static magnetic field generator magnets and to the gradient magnets and to the other units provided in combination therewith.

The magnetic compensation field generator 170 is driven by a driving and control chain which comprises a magnetic noise field sensing module 120, a compensation field control module 130 which processes the output signals of the magnetic noise field sensing module 120 and which compensation field control module 130 generates driving signals of a power module 140. This power module 140 generates power driving signals of the magnetic field compensation generator 170 according to the control signals of the control module 130. The control module 130 drives the power module 140 so that a magnetic compensation field is generated and superimposed to the static magnetic field and to the noise field inside the spatial volume such that the magnetic noise field is compensated in such a way that the remaining noise field inside the spatial volume 160 approaches to zero.

The noise field sensing module comprises at least one magnetic noise field sensor and optionally a sensor control electronics if provided.

Magnetic noise field sensors need to have a fine sensibility since they have to detect and measure magnetic noise fields having generally low intensity.

Usually resistive magnetic sensors are used which are placed in the direct vicinity of the magnetic structure of the MRI scanner, i.e. the static magnetic field generator.

Since the noise field to be compensated is the one inside the gantry of the MRI apparatus and since the parameters of the said noise field inside the gantry are estimated from values of the said parameters measured outside the said gantry, the magnetic sensors need to be placed as near as possible to the static field generator in order to enhance the precision of the estimation of the magnetic noise fields parameter inside the gantry as a function of the measures of the said parameters outside the gantry.

This condition is contrasting with the need that the measured parameters by the magnetic sensor or sensors of the noise field are not influenced by the magnetic field generated by the MRI apparatus and permeating the gantry and the imaging volume inside the said gantry and in particular by the static magnetic field.

In the present specification and in the claims the magnetic field permeating outside the gantry of the MRI apparatus is indicated with the term stray Field or fringe field. The term noise field indicates the AC disturb which must be measured by the sensor and compensated by a corresponding static magnetic field correction inside the gantry of the MRI apparatus.

Typically in combination with mid-field MRI apparatus the magnetic noise field sensors are positioned at distances from the apparatus in the range from 2 m To 3 m.

In the above case of the Mid-field MRI apparatus the static magnetic field dissipating out of the gantry (Stray Field) and at the sensor position have a strength in the range from 2-3 gauss to 10 gauss.

In order to enhance image quality and to be able to acquire NMR images of the so-called soft tissues having a quality which is sufficient for diagnostic aims, the trend is to increase as much as possible the static magnetic field intensity.

For orthopaedic MRI generally so called low field MRI apparati are used.

In order to have better images of the soft tissues such as cartilage or similar tissues, also in the MRI apparatus for orthopaedic diagnosis middle field strength are provided and the current trend is to further enhance the static magnetic field intensity reaching in the field of the so called High field MRI scanners.

The following table reassumes typical quantitative ranges of the field strength for the different types of MRI apparatus:

Low field→below 0.3T
Mid-field→0.3T to 1.0T
High field→1.0T to 3.0T
Very high field→3.0T to 7.0T
Ultra high field→above 7.0T As it will appear from the following there is a maximum stray field which can be compensated and which depends on the maximum current which can be applied at a certain distance from the gantry of the MRI system in order not to disturb the magnetic field in the said gantry.

The intensity between the stray field generated by an MRI system and the intensity of the static magnetic field B0 of the MRI system is given by the following equation:

$$B_{SF} = B_{SF}(B_0)$$

In which B0 is the static magnetic field at the centre of the gantry.

$$B_{SF} = B_{SF}(B_0, \rho)$$

An MRI system can be approximated by a magnetic dipole having a magnetization M. The field generated by the dipole is:

$$\overrightarrow{B_{dip}} = \frac{\mu_0}{4\pi\rho^5}(3(\overrightarrow{M} * \overrightarrow{\rho}) - \rho^2 \overrightarrow{M}) \quad (1)$$

In which $\overrightarrow{\rho}$ is the vector of the distance to be interpreted as the distance of the dipole from the sensor and $B_{dip}$ is the stray field $B_{SF}$.

Considering $\overrightarrow{\rho}$ and $\overrightarrow{M}$ being orthogonal equation 1 becomes:

$$\overrightarrow{B_{dip}} = -\frac{\mu_0}{4\pi\rho^3}\overrightarrow{M} \quad (2)$$

Defining $V_{mag}$ as the volume of the dipole and $B_r$ the remanence of the magnetic material the following equation is obtained:

$$|M| = \frac{B_r V_{mag}}{\mu_0} \quad (3)$$

Substituting equation (3) in (2) and considering the module we have:

$$|\overrightarrow{B_{dip}}| = B_{SF} = \frac{B_r V_{mag}}{4\pi\rho^3} \quad (4)$$

The relation between $B_r$ and $B_0$ depends strongly from the kind of the magnetic circuit considered, such as the shape of the magnet of the MRI system. Thus in the following the shape of the magnet is approximated by a magnetic system consisting in two identical magnetic dipoles having magnetization $\overrightarrow{M}$ and placed at a distance 2*d corresponding to the gap of the cavity defined by the gantry.

Considering equation (1) and setting $\overrightarrow{\rho} = \overrightarrow{d}$ and further considering that there are two sources of the magnetic field corresponding to the said two dipoles, the following equation is obtained:

$$|\overrightarrow{B_{dip}}(0)| = B_0 = \frac{\mu_0}{2\pi d^3}|\overrightarrow{M}| \quad (5)$$

Substituting equation (3) in equation (5) the following equation is obtained:

$$B_r = \frac{2\pi d^3}{V_{mag}} B_0 \quad (6)$$

Finally inserting equation (6) in equation (4) and considering a further additional factor 2 due to the presence of two dipoles the following equation is obtained:

$$B_{SF} = B_{SF}(B_0, \rho) = \left(\frac{d}{\rho}\right)^3 B_0 \quad (7)$$

From this the following numeric example can be obtained considering a low filed system:

$$B_0 = 0.4T; \, d = 0.2m; \, \rho = 2m \rightarrow B_{SF} = 4*1e^{-4} \, T = 4 \text{ gauss}$$

Considering big distances $\rho$ of the sensor and a couple of coils between which the sensor is placed, the magnetic field is $$B_{coils} \cong \frac{\mu_0}{2\rho^3} a^2 I \quad (8)$$

When compensating the stray field at the sensor the field $B_{coils}$ compensating the stray field at the sensor position must not perturbate the homogeneity of the magnetic field in the gantry of the MRI system. This is the case when $$B_{coils} \cong 1e^{-7} B_0 << B_0 \quad (9)$$

Considering a=0.02 m, $\rho$=2 m the maximum current is calculated as $$I_{MAX} \simeq 1e^{-7} \frac{2\rho^3}{\mu_0 a^2} B_0 \simeq 1300 \text{ A}$$

In a configuration in which a sensor is positioned at the center between two coils, the two coils generate a field $B_{corr}$ which is described by the equation $$B_{corr} = \frac{\mu_0 a^2}{(a^2 + z^2)^{3/2}} I \quad (10)$$

Using Imax on equation 10 we obtain:

$$B_{corr}^{MAX} = \frac{\mu_0 a^2}{(a^2 + z^2)^{3/2}} I_{MAX} \simeq 300 \text{ gauss}$$

Considering z=a=0.02 m.
The magnitude of maximum field obtained is of two orders bigger of the stray field $B_{SF}$ From the above it is possible to provide a universal relation between the distance $\rho$ of the position of the sensor from the center of the gantry and the current in the magnetic circuit needed to compensate of the stray field. This relation is obtained by combining equation (10) with equation (7):

$$I\rho^3 = \frac{d^3(a^2 + z^2)^{3/2}}{a^2 \mu_0} B_0 \quad (11)$$

The equation allows to calculate the minimum distance of the sensor from the gantry of the MRI system when the maximum current is known or viceversa to calculate the maximum current for a certain distance of the sensor from the gantry. From this value of the maximum current it is also possible to determine the maximum stray field which can be compensated at the position of the sensor.

Thus a problem of the present invention is to compensate at the sensor position the stray field permeating outside the magnet of the MRI system and at the same time avoid that the magnetic compensation field of the stray field at the sensor position generates disturbs of the static magnetic field of the MRI system.

Relating to the magnetic noise fields, different kinds of such noise fields may be generated by several different types of sources and, depending on the latter, noise fields may have different frequencies. A first type of noise field is mainly determined by street traffic or the like, which generates noise fields with frequencies of the order of a few Hz.

A second type includes magnetic fields generated by sources which use mains Alternating Current, such as railways or tramways, or the like. In this case, noise fields have frequencies of the order of mains frequency such as for example frequencies about 50 to 60 Hz. Furthermore, electric sources may exist which use currents with frequencies corresponding to a rational fraction of the mains current, which generate noise fields having frequencies of about 10 to 20 Hz. A practical analysis of noise fields leads in first approximation to two or possibly three noise field types, which have markedly different frequencies, and may be discriminated from each other and processed separately in an optimized manner. Further regarding magnetic field propagation laws, the two or three different types may differ due to the considerable difference between the generation sources associated to the corresponding noise fields.

This variable noise fields may be differentiated from a static magnetic field and the sensors needed to measure the strength of the static magnetic fields and of the variable fields are of different configuration and costs.

For example a sensor suitable for measuring the magnetic noise fields is commercially available under the name Mag-13MC1000 from Bartington (flux gate). This sensor operates in the range till +−10G maintaining a high resolution <1 uGrms.

The total cost including the shielding box is a bout 2000 euros.

The precision needed is usually <70 uGpp, while the range of the static field intensity is higher.

In an example of embodiment of the present invention there is provided to use magneto resistive sensors as for example Honeywell HMC 1022 or 1002. These sensors have a suitable resolution (<90 uGpp) and can operate at intensities of the static field to be compensated lower than <±6G) at a cost of less than 10$. In a preferred embodiment the sensor is provided in combination with a three axial sensor or there are provided three sensors oriented each according an axis of three orthogonal axis and which three axial sensor or the said three sensors operates at higher ranges of the static field intensity and have a low resolution.

Due to the increase of the static magnetic field strength the strength of the magnetic field permeating outside the gantry and the space around the MRI apparatus increases. This increase of the strength of the static magnetic field permeating outside the scanner may reach values that are considerably higher than the strength of the noise fields at the position of a magnetic sensor for measuring the said magnetic noise field.

In this case the said magnetic sensor or the said magnetic sensors are blinded, i.e. saturated by the static magnetic field permeating out of the gantry of the MRI apparatus so that the measurement of the magnetic noise field becomes impossible or uncertain preventing from carrying out a satisfactory compensation of these noise fields inside the gantry.

A solution could be to increase the distance of the sensors from the gantry but this would lower the precision of the estimation of the noise field inside the gantry as a function of the parameters of the noise field measured at the probe or probes positions.

A further solution could be to use different sensors available on the market. These sensors and the related electronic circuits are remarkably more expensive than the resistive ones currently used for measuring the magnetic noise fields outside the gantry.

OBJECTS AND SUMMARY

An object of the present invention consists in providing a magnetic field sensor, in particular for measuring magnetic noise fields caused by environmental magnetic noise in combination with MRI apparatus, which overcomes the drawbacks of the current magnetic field sensors as discussed above.

A further object of the present invention is to provide for a magnetic field sensor which is relatively low cost and which can be configured to operate in different conditions in relation to the magnetic fields present at the sensor position. This allowing to avoid the need of different kinds sensors each kind being suited for certain conditions in relation to the magnetic field at the sensor position.

A further object consist in avoiding the higher costs caused by providing different kinds of sensors. Furthermore there is no more the need of rendering available for the production at least two different kind of sensors with their dedicated electronic drivers particularly for noise field compensation circuits in combination with MRI apparatus instead then only one kind.

A further object of the present invention is to provide for a method for measuring magnetic field, in particular magnetic noise fields in presence of other magnetic fields having higher strength than the magnetic noise fields and blinding the magnetic sensors for measuring the said noise fields.

Still a further object of the present invention is to provide a method and a system for compensating magnetic noise fields in a spatial volume, which allows to effectively manage the contemporaneity of the said magnetic noise fields and of a static magnetic field generated by a static field generator of an MRI apparatus and dissipating out of the said static magnetic field generator or outside the gantry of the MRI apparatus at the position of a sensor for measuring the said magnetic noise field and blinding the said sensor.

An embodiment the present invention relates to a magnetic field sensor, in particular for measuring magnetic noise fields caused by environmental magnetic noise in combination with MRI apparatus, the said magnetic field sensor being further provided with field compensation coils assembly and with a compensation circuit driving the said field compensation coils assembly to generate a magnetic field compensating the static magnetic field dissipating outside from the static magnetic field generator or from the gantry of the MRI apparatus at the position of the magnetic sensor.

According to a further embodiment the said magnetic sensor is a resistive sensor.

According to an embodiment the compensation circuits driving the compensation coils assembly is provided in combination with a static magnetic field sensor measuring the strength of the static magnetic field dissipating outside the static magnetic field generator or from the gantry of the MRI apparatus at the position of the magnetic sensor for the magnetic noise fields.

As already discussed above, in order to measure the strength of a static magnetic field differently configured sensors are needed as for measuring time variable fields like the magnetic noise fields and the costs of the first ones are lower that the costs for the second ones.

According to still a further embodiment the said magnetic sensor is provided in combination with a first compensation coils assembly configured to carry out a raw compensation of the effects of the static magnetic field at the position of the said sensor and with a second compensation coils assembly configured to carry out a fine compensation of the effects of the static magnetic fields at the position of the said sensor each compensation coils assembly being driven by a compensation circuit the said circuits being tuned respectively for causing a raw and a fine compensation of the effects of the static magnetic field at the sensor position.

According to a further embodiment both compensation circuits for respectively raw and fine compensation of the static magnetic field may be connected to one or more common static magnetic field sensors or each of the said compensation circuits may be connected to at least some dedicated static magnetic field sensors.

According to a further aspect a method is provided for measuring a magnetic noise field in presence of a static magnetic field having a strength saturating a magnetic noise field sensor, the said method providing the steps of:

Placing a magnetic noise field sensor configured for measuring the said magnetic noise field at a predetermined position;

Measuring the strength static magnetic field at the position of the said magnetic noise field sensor;

generating a magnetic compensation field of the said magnetic static field at the position of the said magnetic noise field sensor as a function of the measured strength of the said static magnetic field;

the said magnetic noise field sensor being placed in the said compensation field, measuring the magnetic noise field by the said magnetic noise field sensor placed inside the said compensation field.

According to an embodiment of the said method there is provided at least one static magnetic field sensor and at least one compensation coils assembly generating a compensation field at the position of the magnetic noise field sensor.

According to still another embodiment the step of compensating the static magnetic field at the magnetic noise field sensor comprises a first step of a raw compensation and a second step of a fine compensation, two compensation coils assembly being provided.

According to still a further embodiment the raw and the fine compensation of the static magnetic field are carried out by generating a first raw and a further fine compensation field respectively as a function of the strength of the static magnetic field at the position of the magnetic noise field.

The invention relates further to a method for compensating for magnetic noise fields in a spatial volume, comprising the following steps:

providing at least a magnetic noise field sensor at a certain position in space;

measuring the strength of a magnetic static field at the position of the said at least one magnetic noise field sensor;

generating a magnetic compensation field of the said static magnetic field as a function of the measured strength of the said static magnetic field at the position of the said magnetic noise field sensor;

the said magnetic noise field sensor being placed in the said magnetic compensation field;

measuring the strength or other characteristic parameters describing a magnetic noise field outside said spatial volume at least at one location in the surrounding of said spatial volume;

determining by means of the measured characteristic parameters describing the magnetic noise field a compensation magnetic field to be generated outside the spatial volume and which permeates the space outside the spatial volume;

determining, by means of the measured characteristic parameters describing the magnetic noise field a compensation magnetic field which permeates only the space inside the spatial volume.

According to an embodiment the step of generating a magnetic compensation field of the said static magnetic field as a function of the measured strength of the said static magnetic field at the position of the said magnetic noise field sensor comprises a first step of generating a compensation field for a raw compensation of the static magnetic field and a further step of generating a further compensation field for a fine compensation of the said static magnetic field.

According to an embodiment the step of determining the compensation magnetic field which permeates only the space inside the spatial volume is carried out by calculating on a theoretical basis, i.e. according to the laws of electromagnetism, or on an empirical basis, the correlation between the noise field outside the spatial volume and the corresponding noise field inside said spatial volume, or calculating the noise field inside the spatial volume, from the measurement/s of the magnetic field outside the spatial volume;

from the inside magnetic noise field, as determined theoretically or empirically, generating a magnetic compensation field, particularly for neutralizing the noise field in said spatial volume, said compensation magnetic field permeates the spatial volume.

The invention relates also to a system for compensation magnetic noise caused by environmental noise the said system comprising:

at least a magnetic noise field sensor placed at a certain position in a space;

at least a static magnetic field sensor for measuring the strength of a static magnetic field at the position of the said at least one magnetic noise field sensor;

at least a compensation coils assembly for generating a compensation field of the static magnetic field at the position of the said magnetic noise field sensor;

a compensation circuit driving the said at least one compensation coils assembly and configured to generate a compensation field of the said static magnetic field at the position of the said magnetic noise field sensor, the said compensation field being determined as a function of the measured strength of the static magnetic field sensor the at least one static magnetic field sensor being connected to an input of the said compensation circuit;

an open loop magnetic noise field compensator comprising:

at least one magnetic noise compensation field generator generating a magnetic noise compensation field permeating the environment.

According to a further embodiment, the system comprises a first compensation coils assembly and a second compensation coils assembly each one driven by a dedicated compensation circuit, the compensation circuit for the first compensation coils assembly being configured for generating a compensation field of raw compensation of the static field, the second compensation circuit being configured for generating a compensation field of fine compensation of the static field.

According to a further embodiment there is provided a Magnetic Resonance imaging apparatus comprising a cavity for accommodating a body under examination or a part thereof, wherein the apparatus is integrated with a device for compensating for unwanted noise fields in said cavity, wherein the device includes:

A gantry for positioning of a target body;
a static magnetic field generator, generating a static magnetic field inside the said gantry;
at least a magnetic noise field sensor placed at a certain position in a space outside the said cavity;
at least a static magnetic field sensor for measuring the strength of the static magnetic field dissipating outside the gantry or the field generator at the position of the said at least one magnetic noise field sensor;
at least a compensation coils assembly for generating a compensation field of the static magnetic field at the position of the said magnetic noise field sensor;
a compensation circuit driving the said at least one compensation coils assembly and configured to generate a compensation field of the said static magnetic field at the position of the said magnetic noise field sensor, the said compensation field being determined as a function of the measured strength of the static magnetic field sensor the at least one static magnetic field sensor being connected to an input of the said compensation circuit;
a magnetic field measuring unit for determining characteristic data describing a magnetic noise field outside said cavity;
an open loop magnetic noise field compensator comprising:
a first at least one magnetic noise compensation field generator generating a magnetic noise compensation field superposing to the static magnetic field inside the said gantry.

According to a further embodiment the said MRI apparatus is further provided with
a magnetic field compensator controller processing the characteristic data describing the magnetic noise field outside said cavity for providing driving signals of the magnetic compensation field generator causing the generation of a magnetic compensation field of the measured magnetic noise field inside said cavity for neutralizing the magnetic noise field inside said cavity.

According to an embodiment said magnetic field compensator controller comprises a processing unit which processes the characteristic data describing the magnetic noise field outside said cavity by calculating on a theoretical basis or on an empirical basis, a correlation between the characteristic data of the magnetic noise field measured outside the cavity and a corresponding magnetic noise field inside said cavity, or by calculating the characteristic data describing the noise field inside the cavity from the measurements of the characteristic data of the magnetic noise field outside the cavity, and
determines the driving signals of the magnetic compensation field generator causing the generation of a magnetic compensation field of the measured magnetic noise field inside said cavity, from the calculated characteristic data of magnetic noise field inside said cavity.

DETAILED DESCRIPTION

In the following description and in the above introduction, the term "permeating the space outside the spatial volume" is intended to mean permeating the space in which the spatial volume is housed or placed or is a part of the said space, while the term permeating only the space of the spatial volume means that the magnetic field generated is configured in such a way as to be essentially confined to the space of the spatial volume.

Furthermore, the steps of measuring the magnetic noise field nay be carried out with every mean common for the skilled person such as Hall probes, mono axial magnetometers, bi axial and multiaxial magnetometers.

The more generic embodiment of the present method and system may be applied to any kind of spatial volume, for any kind of scope it might be used in which a magnetic noise field has to be compensated. The spatial volume may be a region in space which is defined by an ideal delimitation surface or at least partially by delimitation walls and the environment in which the spatial volume is located can be also a region delimited by ideal surfaces or a room or chamber at least partly delimited by walls.

Figure 1:
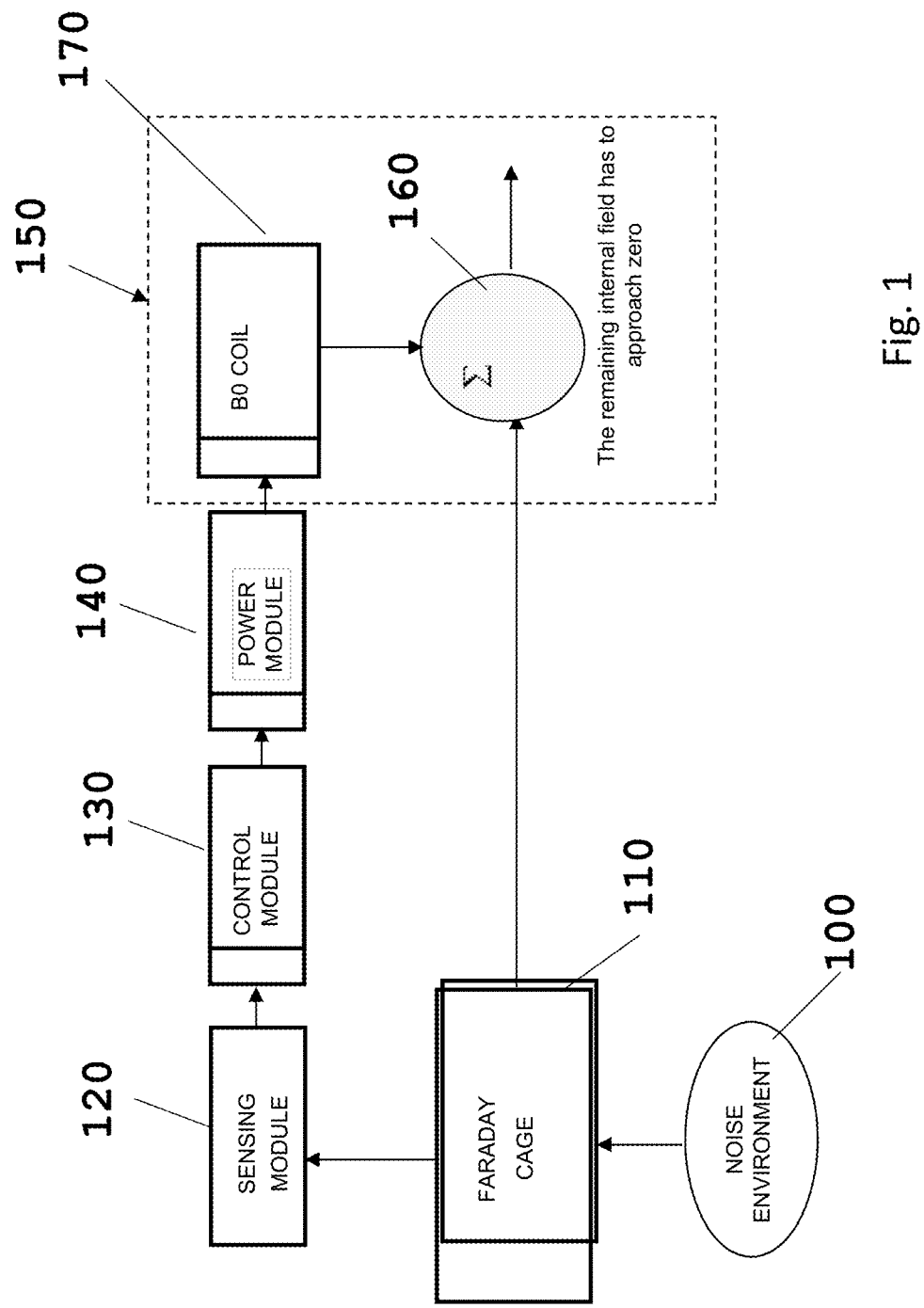
FIG. 1 is a block diagram of an open loop compensator for unwanted noise magnetic fields according to the prior art.
Figure 2:
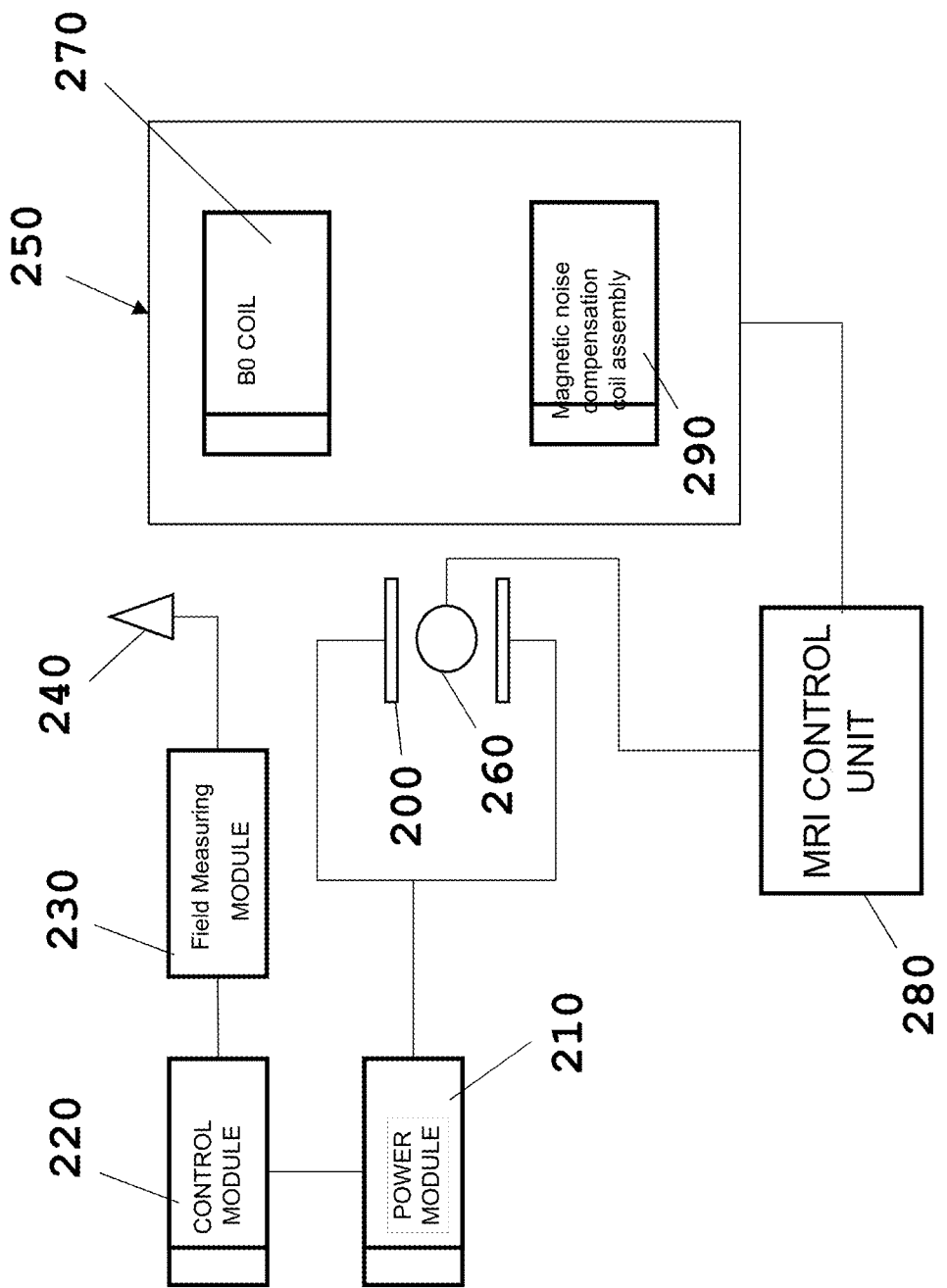
FIG. 2 schematically shows an MRI imaging apparatus comprising an open loop magnetic noise field compensator according to an embodiment of the present invention.

FIG. 2 shows a high-level block diagram illustrating a basic embodiment of the present invention.

Although the embodiment of FIG. 2 describes a sensor for measuring magnetic noise fields in combination with an MRI apparatus, the skilled person is aware of the fact that the described system can be provided in combination with many different devices for which the measurement of magnetic noise fields is needed or required. Thus, the example of FIG. 2 should not be interpreted as limiting the scope of application of the method and system according to the present invention and to the more general definitions given in the above description and in the claims.

With 270 a static magnetic field generator named B0 coil is indicated. This static magnetic field generator is responsible for generating the static magnetic field of an MRI apparatus indicated by 250. This static magnetic field permeates a gantry for positioning of a target body.

The operation and different units of the MRI apparatus are driven by a MRI control Unit 280 which provides also for driving the static magnetic field generator as well as a magnetic noise compensation coil assembly 290 for generating a compensation field of the magnetic noise diffusing into the gantry and superposing to the static magnetic field.

The magnetic noise compensation field is generated by the control unit 280, for example by a dedicated section of this control unit, as a function of at least one or more parameters of the magnetic noise field measured outside the gantry of the MRI apparatus by a magnetic noise field sensor 260. One or more sensor 260 may be provided and these sensors have to be placed outside the gantry in order not to be saturated by the static field permeating the gantry.

The noise field compensation field inside the gantry is determined as a function of the parameters characterising the magnetic noise field measured outside the gantry at a certain distance from the MRI apparatus i.e. of the static field generator 270 or the gantry.

Determining of the relation between the magnetic noise field parameters outside the gantry and inside the gantry may be carried out using mathematical functions which based on the electrodynamics of the system estimate the parameters of the noise field inside the gantry as a function of the measured values at a certain position relatively to the gantry and outside the gantry.

Thus, in order to have high accuracy of the estimation, the magnetic noise field sensor should be placed as near as possible to the gantry. On the other hand the distance and position of the sensor relatively to the gantry or to the magnetic field generator 270 should not be too short for avoiding saturation of the magnetic noise field sensor by the static magnetic field dissipating outside the gantry at the position of the said sensor.

In order to avoid saturation of the magnetic noise field sensor due for example to the fact that following the current trend the static magnetic field strength is continuously increased in the MRI apparatus of the new generation, according to the present embodiment, to each magnetic noise field sensor 260 there is associated a static magnetic field compensation coils assembly indicated with 200 in FIG. 2.

The compensation coils assembly 200 is driven by a compensation circuit comprising a control module 220 controlling a power module 210 generating the driving electric signal of the compensation coil assembly 200.

According to an embodiment it is possible to determine the strength of the compensation field at the sensor 260 by determining experimentally the strength of the static magnetic field dissipating at the position of the sensor 260.

In this case the electric signal driving the power module 210 and the power signal driving the coils assembly 200 generated by the power module is determined by the control module 220 as a function of the said experimental data on the strength of the static magnetic field dissipating at the sensor 260.

Considering that MRI apparatuses are produced according to predefined configuration the said experimental data can be assumed to be identical for each apparatus of the same type or each apparatus is submitted to a separate experimental measurement of the static magnetic field strength at the position or at the positions of the one or more magnetic noise field sensors.

According to a variant embodiment which could be also provided as an alternative that can be available in the same embodiment and which can be selected alternatively or in combination with the above disclosed one, the compensation field of the static magnetic field at the sensor 260 may be determined as a function of measured parameters of the static magnetic field at the sensor 260 which parameters as for example the strength are measure by a static magnetic field sensor indicate 240 and placed in the vicinity of the magnetic noise field sensor 260.

According to still a further variant embodiment instead of only one compensation coil assembly 200, to each magnetic noise field sensor there may be associated two compensation coils assembly each one driven by a dedicated compensation circuit. One compensation coil assembly and the corresponding compensation circuit are configured for generating a compensation field which provides for a raw compensation of the static magnetic field at the corresponding sensor 260. The further compensation coil assembly and the associated compensation circuit are configured for generating a compensation field which provides for a fine compensation of the static magnetic field at the corresponding sensor 260. The two compensation fields being superimposed at the sensor 260. This feature allows to provide differently structured coil assembly and differently structured circuits which are optimized for generating two different fields as for the strength of the said fields.

FIG. 2 shows only one static field sensor 240 and only one magnetic noise field sensor 260. According to variant embodiments the system may be provided with two or more static field sensors and with two or more magnetic noise field sensors as it will appear more clearly in the description of the embodiment of FIG. 3.

Figure 3:
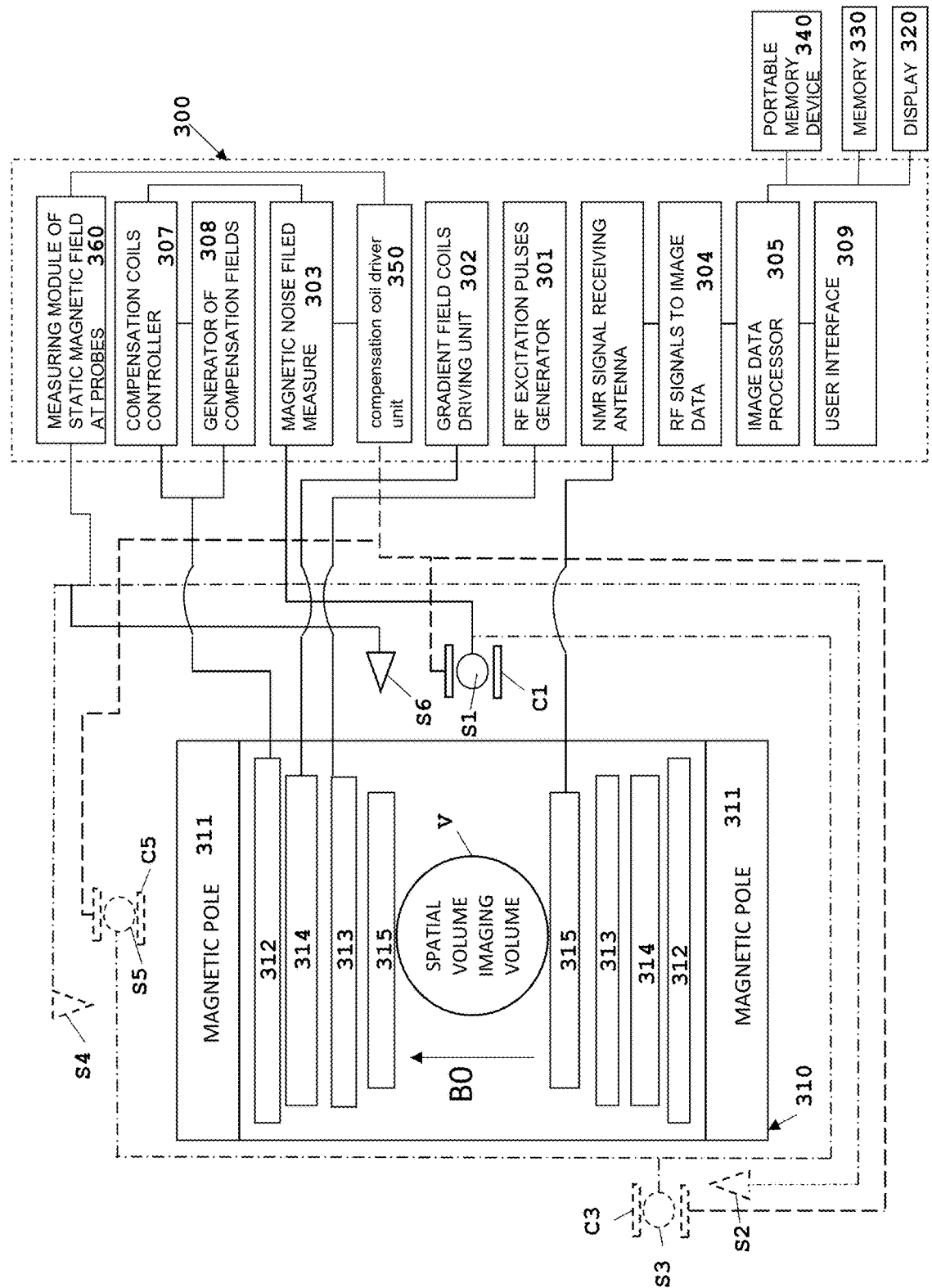
FIG. 3 shows a scheme of an embodiment of an MRI apparatus with a magnetic noise field compensator according to an embodiment the present invention.

FIG. 3 shows a block diagram of a Magnetic Resonance imaging apparatus which integrates an open loop magnetic noise field compensator device according to the invention.

In this case, the spatial volume wherein the noise fields which are to be compensated coincide with the cavity of the Magnetic Resonance imaging apparatus which is to accommodate the patient body or a part thereof and is indicated as V.

FIG. 3 describes an embodiment, which includes at least one probe S1 for measuring the magnetic noise field and which is placed outside the spatial volume V and the gantry of the MRI apparatus. According to a possible variant embodiment, as indicated with dotted lines further probes for measuring the parameters of the magnetic noise fields may be provided which can be placed at different positions in the vicinity of the MRI apparatus according to predetermined positions and to predetermined distances of the said probes from the apparatus. These further probes for measuring the magnetic noise field are indicated by S3 and S5.

Each probe S1, S3, S5 for measuring the parameters of the magnetic noise fields is provided in combination with at least a dedicated compensation coils assembly indicated respectively with C1, C3 and C5. This compensation coils assembly is driven in order to generate at the position of the corresponding probe a magnetic compensation field of the static magnetic field dissipating outside from the gantry of the MRI apparatus at the position of the corresponding probe S1, S3, S5.

The compensation coils assemblies C1, C3, C5 are driven by a probe compensation coil driver unit 350. This unit may consist in a pure hardware unit or a combination of hardware and software such as a processing unit which executes a program comprising the instructions for configuring the processing unit to carry out the functions of the compensation coil driver unit 350.

The compensation driver unit 350 of the probe compensation coils assembly C1, C3, C5 may be a common compensation driver unit as indicated in the example of FIG. 3 or separate driver units are provided each one for one of the compensation coils assemblies of the different probes S1, S3, S5.

The said compensation coils assembly driver unit or units are configured to generate a driving signal of the corresponding compensation coils assembly which is generated as a function of parameters describing the static magnetic field dissipated outside the gantry at the position of the corresponding probe S1, S3, S5.

Two possible modes may be available alternatively. According to a first mode, the data relating to the characteristic parameters describing the static magnetic field dissipated outside the gantry at a probe S1, S3, S5 are determined once for every type of MRI apparatus or for every single MRI apparatus in an experimental way for example during the factory settings of the said MRI apparatus. These data which for example comprises the strength of the static magnetic field at the position of a probe S1, S3, S5 is then used for calculating the parameters of a compensation field which compensates the said static magnetic field thereby avoiding partial or complete saturation of the corresponding probe S1, S3, S5.

According to the further alternative, the parameters of the static magnetic field dissipating outside the MRI apparatus at a probe position of the probes S1, S3, S5, for example comprising the strength of the said static magnetic field, are measured by static magnetic field probes which are indicated by S2, S4, S6. The outputs of these probes is connected to an input of a measuring electronic module 360 of the said probes, which communicates with the compensation coils driver unit 350.

The two alternatives may be both available at the same time for the users and a selector for selecting one of the said alternatives may be provided.

Similarly to the case of the compensation coils assembly driver unit 350, also the measuring module 360 may be a common measuring module for the one or more static magnetic field probes S2, S4, S6 or each of the said probes may be associated to a dedicated module 360.

It has to be noted that the compensation coils assemblies C1, C3, C5 are constructed in such a way that the compensation field generated by the said assemblies permeate the corresponding probe S1, S3, S5, i.e. the said probe is inside the said compensation magnetic field.

According to a further embodiment, which has been described in combination with the preceding examples, each magnetic noise field-measuring probe S1, S3, S5 may be provided with two compensation loops of the effects of the static magnetic field at the corresponding probe, each of the said loops comprising a dedicated compensation coils assembly and a dedicated driving unit of the said compensation coils assembly. One of the said loops being configured for carrying out a rough compensation action, while the further compensation loop being configured to carry out a fine compensation action.

According to a possible embodiment, the first compensation loop operating a rough compensation may be optimized in order to generate a compensation magnetic field which strength or characteristic parameters are such to compensate at a high percentage the effect of the static magnetic field at the corresponding probe. The further compensation loop can then be optimized to generate a compensation magnetic field having parameters and particularly a strength destined to cover the part of the static magnetic field not compensated by the first compensation loop, the compensation fields generated by the two loops being combined such as superimposed.

In FIG. 3, a dashed line and the numeral 300 denote the control and processing electronics of a Magnetic Resonance imaging apparatus, whereas the blocks included therein are additional functional units, or have functions accomplished by appropriately programmed or controlled units of the Magnetic Resonance imaging apparatus.

These control and processing electronics drive the magnetic structure of the MRI system comprising a magnet 310 for generating a static magnetic field B0 within a cavity at least partially delimited by the magnet and within an imaging volume V in said cavity.

The Magnetic Resonance imaging apparatus includes static magnetic field B0 generators, which are denoted with numeral 311.

These static magnetic field generators can be superconductive coils, resistive coils permanent magnets, or combinations thereof.

In an embodiment of the present invention for simplicity the static magnetic field generator comprises two opposite magnetic poles enclosing a cavity for accommodating the body under examination, or a part thereof.

Control electronics of the static magnetic field generator are not illustrated in detail since it is part of the common general knowledge of the skilled person.

Furthermore, the magnet structure of the MRI apparatus comprises at least one magnetic noise field compensation coil 312 for generating inside the cavity and the imaging volume V a magnetic noise compensation field which neutralizes at least partially the effect of the magnetic noise fields on the static magnetic field B0.

The system further comprises at least one exciting pulse transmission coil 313 for transmitting to the body under examination one or more sequences of RF pulses for NMR excitation which coil is controlled by a RF excitation pulse generator 301.

The magnet structure comprises magnetic gradient fields generating coils 314 for generating during scanning, a magnetic field with a predetermined variation along each of three spatial directions (x, y, z) having the function of univocally encoding the nuclear spins and thus allowing to relate the NMR signal contributions of the RF signals received by the RF antenna 315 to a position in space for reconstructing an image. The magnetic gradient fields generating coils 314 are driven by a gradient field coils driving unit 302.

The RF NMR signals are processed by a processing unit converting the RF data into image data indicated by 304 and to an image generation unit 305. The reconstructed images can be displayed on a display 320 or stored in memories 330 which can be, alternatively or in combination, internal memories of the MRI apparatus or memories residing in an external storage servers or in cloud servers. Optionally the images can be stored in portable memory devices 340 such as CD rom, DVD rom CD RAM, DVD RAM, memory sticks, portable hard disks, or similar devices.

A user interface 309 providing alternatively or in combination different user input devices is provided. The user interface may be alternatively or in combination a graphical user interface, a vocal user interface, a keyboard, a mouse or a similar device, a input port of command strings which has been generated by a remote device.

The probe S1 and/or other possible probes S3, S5 are connected to the input of a processing unit 303 for determining characteristic parameters of the magnetic noise field outside the cavity V of the Magnetic Resonance imaging apparatus and this characteristic data is fed to a compensation coils controller 307.

According to an embodiment, the compensation coils controller 307 is provided with a processor unit configured to calculate from theoretical or empiric functions the characteristic parameters of the magnetic noise field inside the cavity from the characteristic parameters of the noise field outside the cavity. The processor unit of the compensation coils controller is also configured to determine the magnetic noise compensation field to be generated inside the cavity for neutralizing the magnetic noise field inside said cavity. This magnetic noise compensation field is determined as a function of the characteristic parameters describing the magnetic noise field inside said cavity which has been determined from the measured characteristic parameters of the magnetic noise field outside the cavity.

The compensation coil controller 307 controls a compensation field generator 308, which provides the driving power signals for feeding the compensation coils 312.

According to an embodiment the control electronics of the MRI apparatus can be entirely or at least in part in the in the form of software units, consisting of programs for controlling programmable hardware of the Magnetic Resonance imaging apparatus, such as a PC or a central processing and control unit. Optionally the control electronics of the MRI apparatus can be entirely or in part dedicated hardware in which the functional logic is incorporated in the hardware.

The compensation coils 312, already resident in the Magnetic Resonance imaging apparatus, are adapted to compensate for substantially uniform and homogeneous static field fluctuations, induced by outside magnetic fields, in the imaging cavity V. Nevertheless, some fluctuations may show some spatial variability within the cavity, i.e., spatial non homogeneities.

In this case, by suitably controlling gradient coils 314, compensation fields may be also generated for these field fluctuations, induced by noise fields, which have non-uniformities and non-homogeneities in space.

Figure 4:
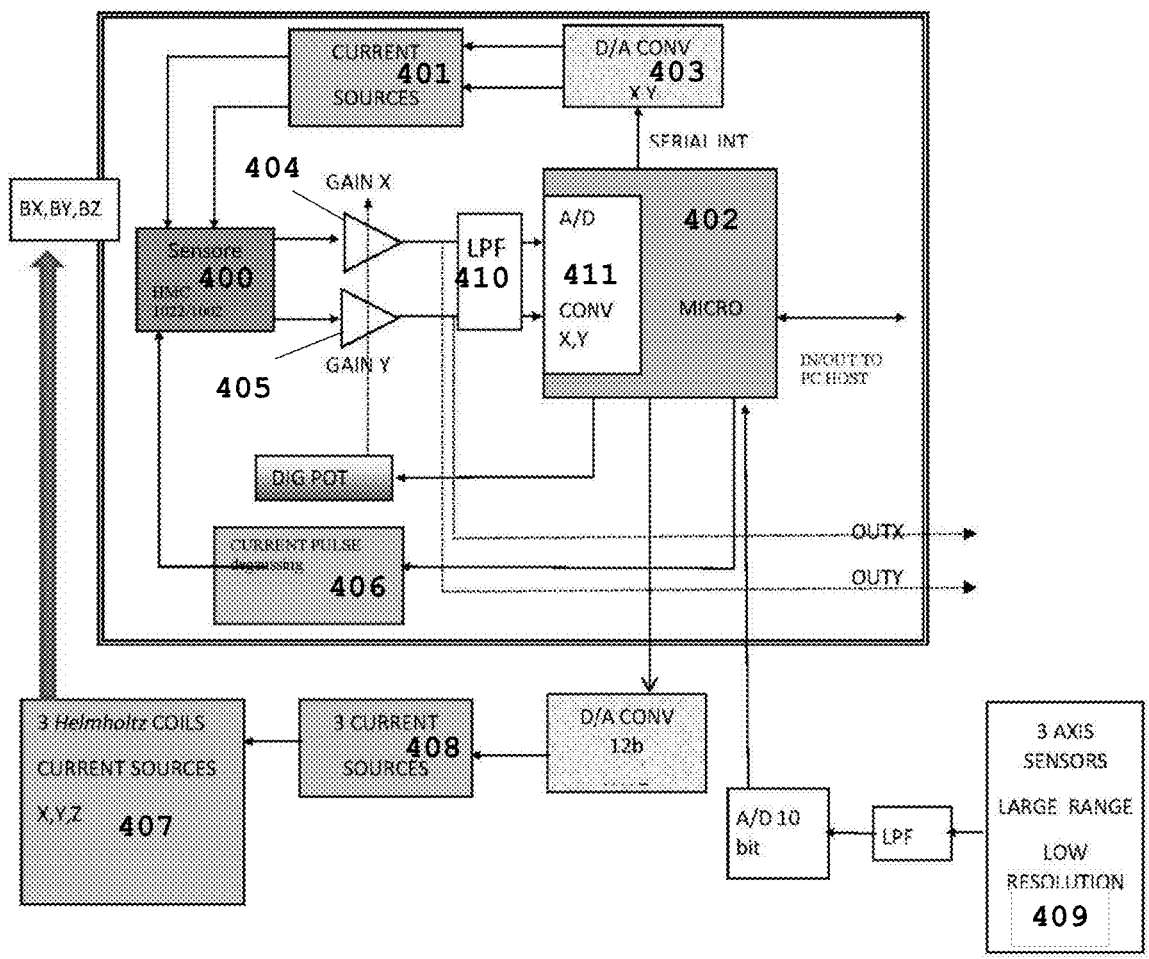
FIG. 4 is an embodiment of a sensor according to the present invention.

FIG. 4 shows a possible embodiment of a sensor according to the present invention. The embodiment t is designed for using an HMC 1022 or 1002 magneto resistive sensor of Honeywell. Indicated with 400 in the circuit of FIG. 4. The sensor 400 is provided in combination with a driving circuit comprising current sources 401 for driving the sensor and which current sources are controlled by a micro processor 402 via a digital/analog converter 403. The sensor outputs are fed via a signal amplifier 404, 405 to the inputs of the microprocessors 402 where an analog to digital converter 411 coverts the analog outputs of the sensor in digital signals.

The microprocessor 402 further drives a degaussing unit 406 connected to the sensor 400. In combination with the sensor 400 there is provided also a compensation field generating resistive magnet consisting in three Helmholtz coils oriented each along an axis of a three-dimensional coordinate system as indicated by 407. The said Helmholtz coils 407 are fed by current sources 408 which are controlled by the microprocessor 402 in order to fed to the Helmholtz coils the current for generating the compensation field of the stray field at the position of the sensor 400 relatively to the magnet of the MRI system. Furthermore a 3 axis sensor 409 is provided in combination with the above components. This three axis sensors are large range sensors and low resolution sensors. Large range sensors means here that the sensors can be applied also with high intensity magnetic field.

The measured signals by the said sensor 409 are also fed to an input of the microprocessor 402.

At power on or at a reset command, a system calibration step starts. During this step the above sensor unit reads for some seconds the data measured by the three axis sensor 409. The low band pass filter 410 has a cut frequency near to 0 Hz. After a time t the microprocessor 402 saves in a memory the measured values of the stray field at the sensor position of the static magnetic field generated by the MRI system. The precision sensor 400 is positioned inside this stray field. The three axis sensors 409 are positioned outside the Helmholtz coils 407 and in any case the stray field is measured with the Helmholtz coils 407 not activated to generate the compensation field.

The microprocessor 402 determines the currents for feeding the Helmholtz coils 407 and for generating the compensation field of the stray field at the sensor position 400. The compensation fields are generated with a strength such as to allow the sensor 400 to operate within its operative range relatively to the magnetic field strength or intensity. In the case of the sensor HMC1022 or 1002, the range of the field to be measured within which range the sensor has a linear response and maximum sensitivity is −5G to +5C.

After the above coarse tuning phase is being carried out a fine tuning phase is started. This phase comprises a first step consisting in activating the sensor 400 and carrying out degaussing operations of the said sensor.

A second step consists in reading the values of the residual static field along the axis of interest. The signals generated by the sensor are converted to digital signals with a certain resolution and the said digitally converted signals are filtered by a low band pass filter 410.

A third step of the fine tuning phase, provides for driving the current sources associated to the sensor 400 such that a couple of coils directly associated to the said sensor and not shown in detail are driven to fine compensating the stray field at the sensor 400 so that this sensor can operate in a 0 G static magnetic stray field.

A fourth step of the fine tuning phase provides for correcting sensibility errors of the sensor by setting the gain of the signal amplifiers at the outputs of the sensor 400. The gain settings of the said amplifiers are stored in a memory of the microprocessor 402 which are not illustrated in detail.

The outputs OUTx and OUTy represents the analog signals of the preceding steps.

The invention claimed is:

1. A magnetic field sensor for measuring magnetic noise fields caused by environmental magnetic noise in combination with an MRI apparatus, the said magnetic field sensor comprising:
a first field compensation coil assembly,
a second field compensation coil assembly, and
a compensation circuit configured to drive the said field compensation coil assemblies to generate a magnetic field compensating a static magnetic field dissipating outside from a static magnetic field generator or from a gantry of the MRI apparatus at a position of the magnetic field sensor,
wherein the first field compensation coil assembly is configured to carry out a raw compensation of the effects of the static magnetic field at the position of the sensor and the second compensation coil assembly is configured to carry out a fine compensation of the effects of the static magnetic fields at the position of the sensor,
each of the field compensation coil assemblies being driven by a respective compensation circuit, the respective compensation circuits being tuned respectively for causing a raw and a fine compensation of the effects of the static magnetic field at the sensor position.

2. Magnetic field sensor according to claim 1 in which the said magnetic sensor is a resistive sensor.

3. Magnetic field sensor according to claim 1, in which the compensation circuits driving the compensation coils assembly is provided in combination with a static magnetic field sensor measuring the strength of the static magnetic field dissipating outside the static magnetic field generator or from the gantry of the MRI apparatus at the position of the magnetic sensor for the magnetic noise fields.

4. Magnetic field sensor according to claim 1, in which both compensation circuits for respectively raw and fine compensation of the static magnetic field are connected to one or more common static magnetic field sensors or each of the said compensation circuits may be connected to at least some dedicated static magnetic field sensors.

5. A method for measuring a magnetic noise field in a presence of a static magnetic field having a strength saturating at least partially a magnetic noise field sensor, the method comprising:
   placing a magnetic noise field sensor configured for measuring the magnetic noise field at a predetermined position;
   measuring a strength of the static magnetic field at the predetermined position of the magnetic noise field sensor with a second sensor;
   generating a magnetic compensation field of the magnetic static field at the predetermined position of the magnetic noise field sensor as a function of the measured strength of the static magnetic field;
   the magnetic noise field sensor being placed in the compensation field, and
   measuring the magnetic noise field by the magnetic noise field sensor placed inside the compensation field.

6. Method according to claim 5, wherein there is provided at least one static magnetic field sensor and at least one compensation coils assembly generating a compensation field at the position of the magnetic noise field sensor.

7. Method according to claim 5, in which the step of compensating the static magnetic field at the magnetic noise field sensor comprises a first step of a raw compensation and a second step of a fine compensation, two compensation coils assembly being provided.

8. Method according to claim 7 in which the raw and the fine compensation of the static magnetic field are carried out by generating a first raw and a further fine compensation field respectively as a function of the strength of the static magnetic field at the position of the magnetic noise field.

9. A method for compensating for magnetic noise fields in a spatial volume, the method comprising:
   providing at least a magnetic noise field sensor at a certain position in space;
   measuring a strength of a magnetic static field at the position of the at least one magnetic noise field sensor with a second sensor;
   generating a magnetic compensation field of the static magnetic field as a function of the measured strength of the static magnetic field at the position of the magnetic noise field sensor;
   the magnetic noise field sensor being placed in the magnetic compensation field;
   measuring a strength or other characteristic parameters describing a magnetic noise field outside said spatial volume at least at one location surrounding said spatial volume;
   determining by means of the measured characteristic parameters describing the magnetic noise field a compensation magnetic field to be generated outside the spatial volume and which permeates the space outside the spatial volume; and
   determining, by means of the measured characteristic parameters describing the magnetic noise field a compensation magnetic field which permeates only the space inside the spatial volume.

10. Method according to claim 9 in which the step of generating a magnetic compensation field of the said static magnetic field as a function of the measured strength of the said static magnetic field at the position of the said magnetic noise field sensor comprises a first step of generating a compensation field for a raw compensation of the static magnetic field and a further step of generating a further compensation field for a fine compensation of the said static magnetic field.

11. Method according to claim 9, in which the step of determining the compensation magnetic field which permeates only the space inside the spatial volume is carried out by:
   calculating on a theoretical basis according to the laws of electromagnetism, or on an empirical basis, a correlation between the noise field outside the spatial volume and a corresponding noise field inside said spatial volume, or
   calculating the noise field inside the spatial volume, from the measurement/s of the noise magnetic field outside the spatial volume; and
   from the inside magnetic noise field, as determined theoretically or empirically, generating a magnetic compensation field, particularly for neutralizing the noise field in said spatial volume, said compensation magnetic field permeates the spatial volume.

12. A system for compensation magnetic noise caused by environmental noise applying the method according to claim 9, the said system comprising:
   at least a magnetic noise field sensor placed at a certain position in a space;
   at least a static magnetic field sensor for measuring the strength of a static magnetic field at the position of the said at least one magnetic noise field sensor;
   at least a compensation coils assembly for generating a compensation field of the static magnetic field at the position of the said magnetic noise field sensor;
   a compensation circuit driving the said at least one compensation coils assembly and configured to generate a compensation field of the said static magnetic field at the position of the said magnetic noise field sensor, the said compensation field being determined as a function of the measured strength of the static magnetic field sensor the at least one static magnetic field sensor being connected to an input of the said compensation circuit;
   an open loop magnetic noise field compensator comprising:
   at least one magnetic noise compensation field generator generating a magnetic noise compensation field permeating the environment.

13. A system according to claim 12, wherein it comprises a first compensation coils assembly and a second compensation coils assembly each one driven by a dedicated compensation circuit, the compensation circuit for the first compensation coils assembly being configured for generating a compensation field of raw compensation of the static field, the second compensation circuit being configured for generating a compensation field of fine compensation of the static field.

14. A Magnetic Resonance imaging apparatus comprising a cavity for accommodating a body under examination or a part thereof, wherein the apparatus is integrated with a device for compensating for unwanted noise fields in said cavity, wherein the apparatus comprises:
   a gantry for positioning the body;
   a static magnetic field generator configured to generate a static magnetic field inside the gantry;
   at least a magnetic noise field sensor placed at a certain position in a space outside the said cavity;

at least a static magnetic field sensor for measuring a strength of the static magnetic field dissipating outside the gantry or the field generator at the position of the said at least one magnetic noise field sensor;

at least a compensation coils assembly configured to generate a compensation field of the static magnetic field at the position of the said magnetic noise field sensor;

a compensation circuit configured to drive the at least one compensation coils assembly and configured to generate a compensation field of the static magnetic field at the position of the said magnetic noise field sensor, the compensation field being determined as a function of the measured strength of the static magnetic field sensor, the at least one static magnetic field sensor being connected to an input of the compensation circuit;

a magnetic field measuring unit for determining characteristic data describing a magnetic noise field outside said cavity;

an open loop magnetic noise field compensator comprising:

a first at least one magnetic noise compensation field generator generating a magnetic noise compensation field superposing to the static magnetic field inside the said gantry.

15. MRI apparatus according to claim 14 wherein the said apparatus is further provided with a magnetic field compensator controller processing the characteristic data describing the magnetic noise field outside said cavity for providing driving signals of the magnetic compensation field generator causing the generation of a magnetic compensation field of the measured magnetic noise field inside said cavity for neutralizing the magnetic noise field inside said cavity and in which said magnetic field compensator controller comprises a processing unit which processes the characteristic data describing the magnetic noise field outside said cavity by calculating on a theoretical basis or on an empirical basis, a correlation between the characteristic data of the magnetic noise field measured outside the cavity and a corresponding magnetic noise field inside said cavity, or by calculating the characteristic data describing the noise field inside the cavity from the measurements of the characteristic data of the magnetic noise field outside the cavity, and determines the driving signals of the magnetic compensation field generator causing the generation of a magnetic compensation field of the measured magnetic noise field inside said cavity, from the calculated characteristic data of magnetic noise field inside said cavity.

* * * * *